(12) United States Patent
Galal

(10) Patent No.: US 7,622,994 B2
(45) Date of Patent: Nov. 24, 2009

(54) BIAS CIRCUIT WITH INCREASED POWER SUPPLY REJECTION

(75) Inventor: Sherif Galal, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 68 days.

(21) Appl. No.: 11/545,165

(22) Filed: Oct. 10, 2006

(65) Prior Publication Data

US 2008/0084246 A1    Apr. 10, 2008

(51) Int. Cl.
H03F 1/30 (2006.01)
(52) U.S. Cl. ............... 330/290; 330/259; 330/261; 330/285; 330/296
(58) Field of Classification Search .......... 330/85, 330/253, 255, 259, 260, 261, 285, 290, 296; 323/280
See application file for complete search history.

(56) References Cited

U.S. PATENT DOCUMENTS 5,945,818 A * 8/1999 Edwards .................. 323/280
6,465,994 B1 * 10/2002 Xi ........................... 323/280
6,885,244 B2 * 4/2005 Shor ......................... 330/253
2007/0018621 A1 * 1/2007 Mok et al. ................ 323/280

* cited by examiner

Primary Examiner—Khanh V Nguyen
(74) Attorney, Agent, or Firm—Farjami & Farjami LLP

(57) ABSTRACT

According to one exemplary embodiment, a power supply rejection bias circuit includes a first amplifier coupled to a second amplifier, where the first amplifier receives a reference voltage, and a feedback voltage of the bias circuit. The bias circuit further includes an output transistor driven by the output of the second amplifier, where the output transistor provides the output of the bias circuit and the feedback voltage. The bias circuit further includes a feedback resistor coupled between an input and an output of the second amplifier. According to this embodiment, the output of the second amplifier forms a non-dominant pole of the bias circuit and the output of the bias circuit forms a dominant pole of the bias circuit, thereby increasing power supply rejection of the bias circuit.

17 Claims, 4 Drawing Sheets

BIAS CIRCUIT WITH INCREASED POWER SUPPLY REJECTION

BACKGROUND OF THE INVENTION

1. Field of the Invention

The present invention is generally in the field of electrical circuits. More particularly, the invention is in the field of bias circuits.

2. Background Art

Microphones, such as microphones used in cell phones, computers, and handheld audio devices, typically require a stable bias voltage to operate. For proper microphone operation, the bias voltage needs to remain at a constant level that is independent of the load current, i.e. the amount of current that flows into the microphone. Furthermore, the bias voltage needs to have low noise to ensure sufficient audio quality and should be very insensitive to any variation on the power supply to maintain a stable voltage across the microphone.

A conventional bias circuit for providing a microphone bias voltage can include a high impedance operational amplifier coupled to a transistor, such as a PMOS transistor. The conventional bias circuit can also include a feedback loop where the output of the bias circuit is sensed using a resistor network and compared to a stable, low noise reference voltage. The operational amplifier can force the feedback voltage to be equal to the reference voltage by appropriately adjusting the gate voltage of the transistor. However, in the conventional bias circuit, noise on the transistor's supply voltage (e.g. VDD) can easily be coupled to the output of the bias circuit, thereby undesirably affecting microphone performance. Thus, the conventional bias circuit typically exhibits poor power supply rejection (PSR), which refers to the capability of the bias circuit to reject variations in supply voltage caused by noise.

SUMMARY OF THE INVENTION

A bias circuit with increased power supply rejection, substantially as shown in and/or described in connection with at least one of the figures, as set forth more completely in the claims.

DETAILED DESCRIPTION OF THE INVENTION

The present invention is directed to a bias circuit with increased power supply rejection. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
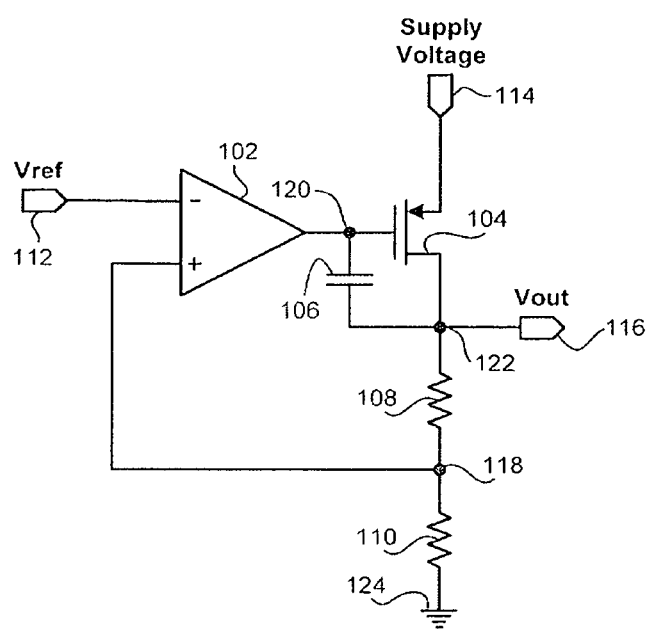
FIG. 1 illustrates a circuit diagram of an exemplary conventional bias circuit.

FIG. 1 shows a circuit diagram of an exemplary conventional bias circuit. Conventional bias circuit 100 includes amplifier 102, output transistor 104, capacitor 106, and resistors 108 and 110. Conventional bias circuit 100 can be utilized to provide a bias voltage for a microphone situated in a handheld audio device, a cell phone, or other suitable electronic device, for example. Conventional bias circuit 100 can be configured to receive reference voltage (Vref) 112 and supply voltage 114 and provide output voltage (Vout) 116.

As shown in FIG. 1, Vref 112, which is a low-noise, stable reference voltage, is coupled to the negative (inverting) input of amplifier 102, which can be a high impedance operational amplifier. Also shown in FIG. 1, the positive (non-inverting) input of amplifier 102 is coupled to first terminals of resistors 108 and 110 at node 118 and the output of amplifier 102 is coupled to the gate of output transistor 104 and a first terminal of capacitor 106 at node 120. A feedback loop in conventional bias circuit 100 includes amplifier 102, capacitor 106, output transistor 104, and resistor 108. Amplifier 102 can be configured to receive Vref 112 and a feedback voltage at respective negative and positive inputs, amplify the difference between the feedback voltage and Vref 112, and provide an output voltage at node 120.

Capacitor 106 undergoes a "Miller" effect, and is referred to as "Miller" capacitance, since the capacitance value of capacitor 106 is effectively magnified (i.e. multiplied) by the gain of the output stage formed by transistor 104 and load resistors 108 and 110. The relatively large value of the gate capacitance of transistor 104 and the "Miller" capacitance 106 between the gate and drain of transistor 104 causes the "internal pole" of conventional bias circuit 100 to be the "dominant pole." That is, the pole at the gate of transistor 104 (i.e. "the internal pole") occurs at a lower frequency (i.e. is "dominant") relative to the pole at the drain of transistor 104 (i.e. "the external pole").

Further shown in FIG. 1, the source of transistor 104 is coupled to supply voltage 114, which can be an unregulated supply voltage such as VDD, and the drain of transistor 104 is coupled to the second terminals of capacitor 106 and resistor 108 at node 122 (i.e. the output of conventional bias circuit 100). Also, shown in FIG. 1, a second terminal of resistor 110 is coupled to ground 124. Node 122, which provides Vout 116, is the external pole of conventional bias circuit 100. In conventional bias circuit 100, the external pole of the bias circuit is also a non-dominant pole. Thus, as noted above, the frequency ($\omega L$) of the external (i.e. non-dominant) pole at node 122 is greater than the frequency ($\omega A$) of the internal (i.e. dominant) pole at node 120.

During operation, a feedback voltage at node 118 is coupled to the positive input of amplifier 102 and compared to Vref 112, which is coupled to the negative input of amplifier 102. Since amplifier 102 is a high impedance operational amplifier, it (i.e. amplifier 102) forces the voltage at node 118 to be equal to Vref 112 by appropriately adjusting the gate voltage of output transistor 104. As a result, Vout 116 can be represented by the equation:

$$Vout = Vref \cdot \left(1 + \frac{R1}{R2}\right) \quad \text{equation (1)}$$

where "R1" is the resistance of resistor 108 and "R2" is the resistance of resistor 110.

Thus, as shown in equation (1), conventional bias circuit 100 provides an output voltage (i.e. Vout) that is proportional to Vref, which is a low-noise, stable reference voltage. However, because of the fact that the pole at the input of transistor 104 (i.e. "the internal pole") occurs at a lower frequency (i.e. is "dominant") relative to the pole at the output of transistor 104 (i.e. "the external pole"), and also due to parasitic capacitance in output transistor 104 and the fact that output transistor 104 is not an ideal transistor, power supply noise on supply voltage 114 (i.e. VDD) can be easily coupled to the output of output transistor 104 and transferred to Vout 116, which is undesirable. Thus, conventional bias circuit 100 provides poor PSR (power supply rejection), which refers to the capability of the bias circuit to reject variations in supply voltage (i.e. VDD) caused by noise.

Figure 2:
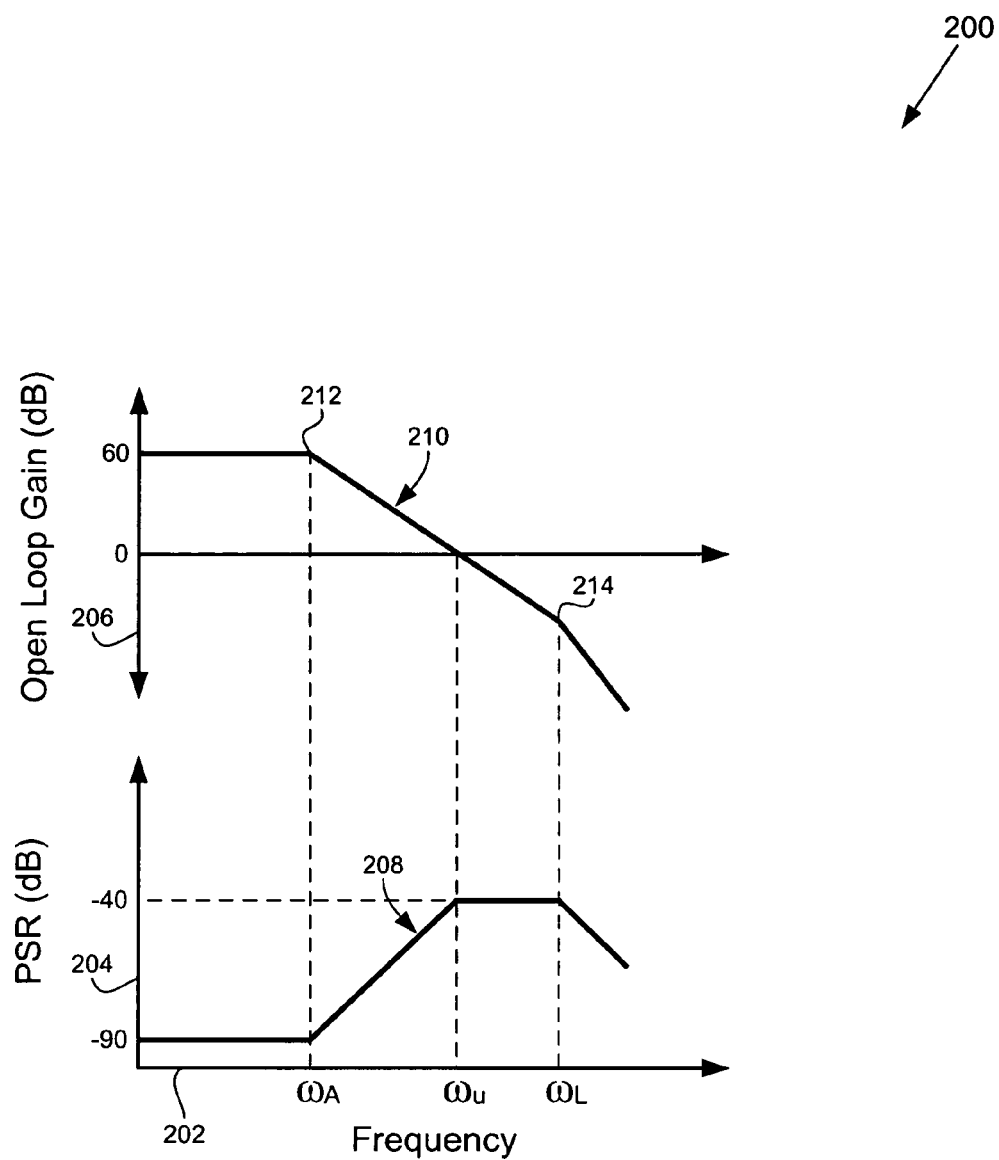
FIG. 2 is a graph showing an exemplary conventional PSR (power supply rejection) curve.

FIG. 2 shows exemplary graph 200 including an exemplary PSR (power supply rejection) curve. Graph 200 includes frequency axis 202, PSR axis 204, open loop gain axis 206, conventional PSR curve 208, and conventional open loop gain curve 210. In graph 200, frequency axis 202 corresponds to an exemplary range of frequency for conventional bias circuit 100 in FIG. 1, PSR axis 204 corresponds to an exemplary range of PSR for conventional bias circuit 100, and open loop gain axis 206 corresponds to an exemplary range of open loop gain for conventional bias circuit 100.

In graph 200, conventional PSR curve 208 and conventional open loop gain curve 210 correspond to respective PSR and open loop gain of conventional bias circuit 100 in FIG. 1. The open loop gain of conventional bias circuit 100 can be determined by breaking the loop at node 120 (i.e. decoupling the output of amplifier 102 from the gate of transistor 104), injecting a signal into the gate of output transistor 104, and measuring the output at the output of amplifier 102, for example. Also, in graph 200, "ωL" is the frequency of the non-dominant pole (i.e. the external pole at node 122) in conventional bias circuit 100 and "ωA" is the frequency of the dominant pole (e.g. the internal pole at node 120) of the bias circuit. Thus, ωL (i.e. the frequency of the non-dominant pole at node 122) is greater than ωA (i.e. the frequency of the dominant pole at node 120).

In the example shown in graph 200, as frequency increases to ωA, conventional PSR curve 208 remains at a substantially constant level. However, as the frequency increases from ωA to ωu, which refers to the frequency at which conventional open loop gain curve 210 at 0.0 dB (i.e. the open loop unity gain frequency), conventional PSR curve 208 decreases (i.e. degrades). It is noted that PSR increases (i.e. improves) as it becomes more negative in value and decreases (i.e. degrades) as it becomes more positive in value. Thus, an increase in PSR indicates an increase in capability to reject noise on the power supply voltage, such as supply voltage 114 (i.e. VDD) in FIG. 1.

Also shown in the example in graph 200, PSR remains between ωu (i.e. the open loop unity gain frequency) and ωL (i.e. the frequency of the non-dominant pole at node 122) and begins to increase (i.e. improve) at frequencies greater than ωL. Thus, as shown in the example in graph 200, conventional bias circuit 100 has a PSR that undesirably decreases (i.e. degrades) at high frequencies (e.g. frequencies greater than ωA).

Figure 3:
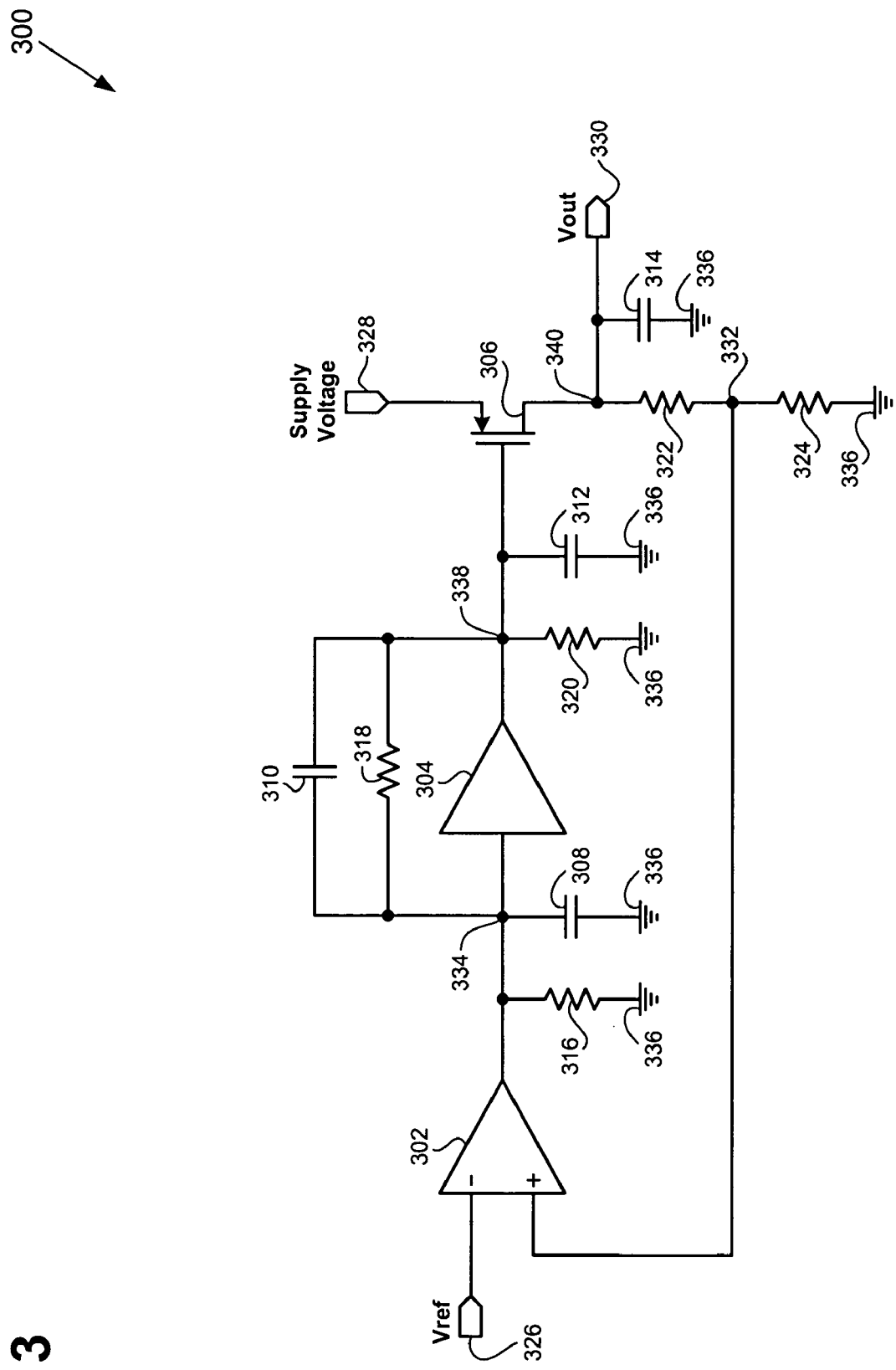
FIG. 3 illustrates a circuit diagram of an exemplary bias circuit in accordance with one embodiment of the present invention.

FIG. 3 shows a circuit diagram of an exemplary bias circuit in accordance with one embodiment of the present invention. Bias circuit 300 includes amplifiers 302 and 304, output transistor 306, capacitors 308, 310, 312, and 314, and resistors 316, 318, 320, 322, and 324. In some other embodiments, bias circuit 300 may include more than two amplifiers. Bias circuit 300 can be utilized to provide a bias voltage for a microphone situated in a handheld audio device, a cell phone, or other suitable electronic device, for example. However, bias circuit 300 can also be utilized in any application that requires a low-noise, high PSR (power supply rejection) bias circuit. Bias circuit 300 is configured to receive Vref (reference voltage) 326 and supply voltage 328 and provide Vout (output voltage) 330.

As shown in FIG. 3, Vref 326, which is a low-noise, stable reference voltage, is coupled to the negative (inverting) input of amplifier 302, which can be an operational amplifier having a wide bandwidth and a large transconductance (Gm1). Also shown in FIG. 3, the positive (non-inverting) input of amplifier 302 is coupled to first terminals of resistors 322 and 324 at node 332 and the output of amplifier 302 is coupled to the input of amplifier 304 and first terminals of resistors 316 and 318 and capacitors 308 and 310 at node 334. Amplifier 302 can be configured to receive Vref 326 and a feedback voltage at respective negative and positive inputs, amplify the difference between the feedback voltage and Vref 326, and provide a current signal at its (i.e. amplifier 302) output at node 334.

Further shown in FIG. 3, second terminals of resistor 316 and capacitor 308 are coupled to ground 336 and the output of amplifier 304 is coupled to second terminals of capacitor 310 and resistor 318, first terminals of resistor 320 and capacitor 312, and the gate of transistor 306 at node 338. Amplifier 304 can be an operational amplifier having a wide bandwidth, high gain, and a large transconductance (Gm2). A combination of amplifier 304 and a feedback resistor (i.e. resistor 318) is configured to receive the current signal provided by amplifier 302 at node 334 and provide an output voltage (Vp) at node 338. The overall voltage gain provided by amplifiers 302 and 304, i.e. Vp divided by the feedback voltage at the positive input of amplifier 302, is equal to the product of Gm1 (i.e. the transconductance of amplifier 302) and the resistance (Rf) of resistor 318, which is a feedback resistor.

Also shown in FIG. 3, second terminals of resistor 320 and capacitor 312 are coupled to ground 336 and the source of output transistor 306 is coupled to supply voltage 328. In the present embodiment, output transistor 306 can be a PMOS transistor. It is noted that although a particular type of transistor, i.e. PMOS transistor, is utilized as an output transistor to illustrate the invention's bias circuit, a different type of transistor could be used as the output transistor in a different embodiment. By way of example and without limitation, in one embodiment, the invention's bias circuit could use a bipolar transistor, such as a PNP transistor, as the output transistor. Supply voltage 328 can be an unregulated supply voltage, such as VDD. Further shown in FIG. 3, the drain of output transistor 306 is coupled to a second terminal of resistor 322 and a first terminal of capacitor 314 at node 340 (i.e. the output of bias circuit 300). Also shown in FIG. 3, second terminals of capacitor 314 and resistor 324 are coupled to ground 336. Node 340, which provides Vout 330, is referred to as "an external pole" of bias circuit 300. As discussed below, according to the present invention, the external pole at node 340 is also the dominant pole of the invention's bias circuit 300.

The operation of bias circuit 300 will now be discussed. Amplifier 302 receives a low-noise, stable reference voltage (i.e. Vref 326) and a feedback voltage (Vf) (provided at node 332) at respective negative and positive inputs, amplifies the difference between Vf and Vref 326, and outputs a current signal a node 334. Amplifier 304 in combination with a feedback resistor (i.e. resistor 318) receives the current signal outputted by amplifier 302 and outputs Vp (an output voltage) at node 338. The overall voltage gain provided by amplifiers 302 and 304 (i.e. Vp/Vf) is equal to Gm1·Rf, where "Gm1" is the transconductance of amplifier 302 and "Rf" is the resistance of resistor 318. Output transistor 306, which is driven by amplifier 304, receives and amplifies Vp and provides an amplified output voltage (i.e. Vout 330) at node 340. A feedback capacitor (i.e. capacitor 310) is utilized to stabilize the local feedback loop in bias circuit 300.

For ease of discussion and illustration, and since both Gm1 and Gm2 are large values and since Gm1 can be substantially the same as Gm2, the impedances at nodes 334 and 338 can be both deemed to be 1/Gm2, where "Gm2" is the transconductance of amplifier 304. In other words, it can be deemed that because amplifier 304 is a high gain amplifier (e.g. a high gain operational amplifier), Gm2 is very large, which causes nodes 334 and 338 to each have a corresponding low impedance, thereby causing the internal poles of bias circuit 300 at nodes 334 and 338 to be at a relatively high frequency, and thus be "non-dominant" poles.

The frequency (ωA) of an internal pole of bias circuit 300 can be represented by the equation:

$$\omega A = \left( \frac{1}{R_A \cdot C_A} \right) \quad \text{equation (2)}$$

where "$R_A$" is the equivalent resistance at the internal pole and "$C_A$" is the capacitance at the internal pole. Since the impedances at nodes 334 and 338 are very low, $R_A$ is very low at nodes 334 and 338. Thus, $R_A$ is sufficiently low such that ωA (i.e. the frequency of the internal pole) at each of nodes 334 and 338 is high.

The frequency (ωL) of the external pole of bias circuit 300 at node 340 can be represented by the equation:

$$\omega L = \left( \frac{1}{R_L \cdot C_L} \right) \quad \text{equation (3)}$$

where "$R_L$" is the equivalent load resistance at node 340, which is equal to the sum of the resistances of resistors 322 and 324, and "$C_L$" is the load capacitance at node 340, which is equal to the capacitance of capacitor 314. Since ωA (i.e. the frequency of the internal pole) at each of nodes 334 and 338 is high, the external pole at node 340 becomes the dominant pole of the bias circuit. By making the external pole of the bias circuit the dominant pole, the present invention advantageously achieves a low-noise bias circuit having increased PSR (power supply rejection), which will be further discussed below in relation to FIG. 4. Also, the present invention can result in the external pole of the bias circuit to be the dominant pole with a load capacitor (i.e. capacitor 314) having a lower capacitance, which advantageously reduces manufacturing cost.

Figure 4:
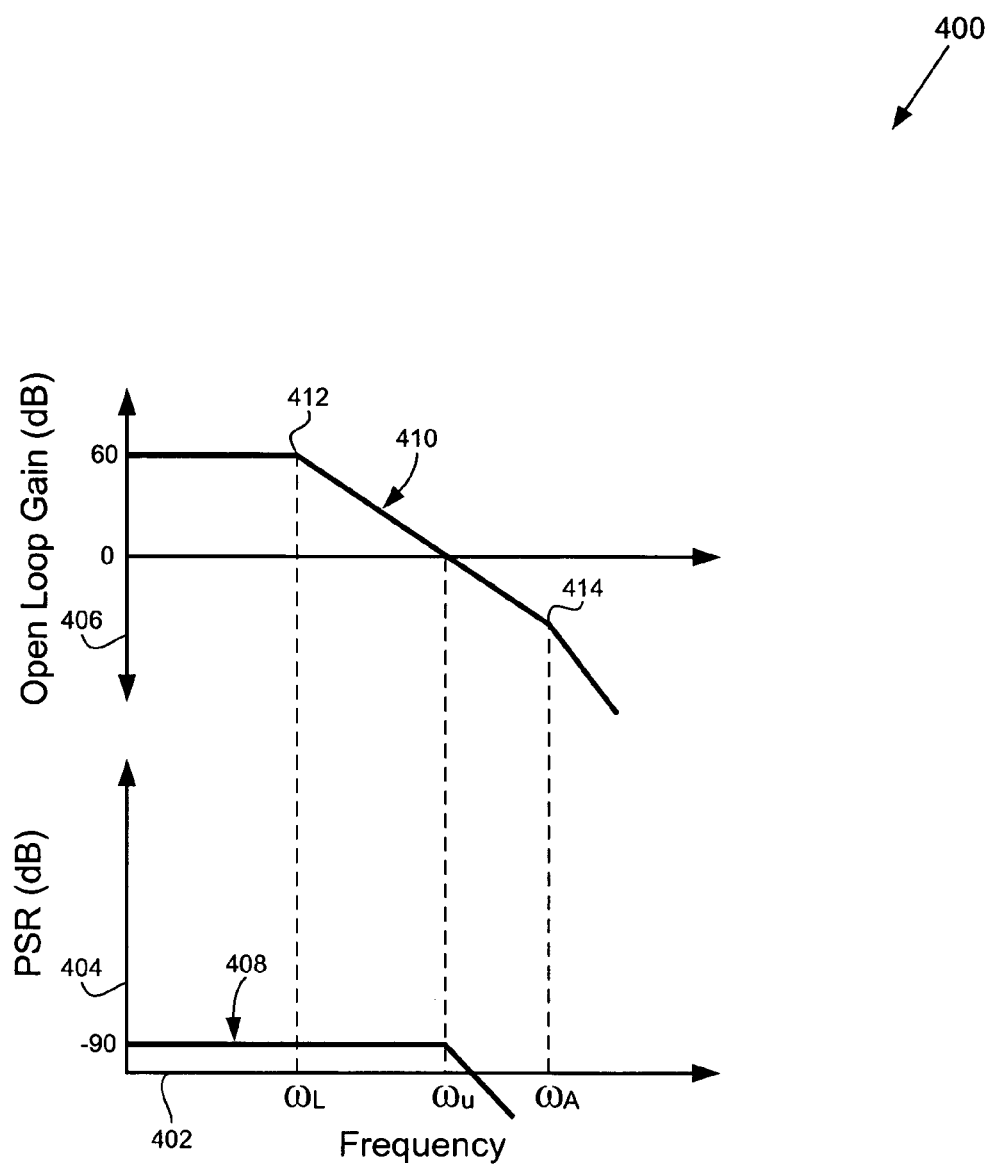
FIG. 4 is a graph showing an exemplary PSR curve in accordance with one embodiment of the present invention.

FIG. 4 shows exemplary graph 400 including an exemplary PSR (power supply rejection) curve in accordance with one embodiment of the present invention. Graph 400 includes frequency axis 402, PSR axis 404, open loop gain axis 406, PSR curve 408, and open loop gain curve 410. In graph 400, frequency axis 402 corresponds to an exemplary range of frequency for bias circuit 300 in FIG. 3, PSR axis 404 corresponds to an exemplary range of PSR for bias circuit 300, and open loop gain axis 406 corresponds to an exemplary range of open loop gain for bias circuit 300.

In graph 400, PSR curve 408 and open loop gain curve 410 correspond to respective PSR and open loop gain of bias circuit 300 in FIG. 3. The open loop gain of bias circuit 300 can be determined by breaking the loop at node 338 (i.e. decoupling the gate of transistor 306 from node 338), injecting a signal into the gate of output transistor 306, and measuring the output at the output of amplifier 304, for example. Also, in graph 400, "ωL" is the frequency of the dominant pole (i.e. the external pole at node 340) of bias circuit 300 and "ωA" is the frequency of a non-dominant pole (e.g. the internal pole at node 338) of bias circuit 300. As shown in FIG. 4, according to the present invention, ωA (i.e. the frequency of a non-dominant pole) is greater than ωL (i.e. the frequency of the dominant pole).

In the example shown in graph 400, as frequency increases to ωu (i.e. the open loop unity gain frequency), PSR curve 408 remains at a substantially non-varying level. As the frequency increases from ωu to ωA, PSR curve 408 significantly increases (i.e. improves). Thus, as shown in the example in graph 400, PSR curve 408 increases at frequencies greater than ωu. Thus, bias circuit 300 provides a PSR that increases (i.e. improves) for frequencies greater than ωu (i.e. the open loop unity gain frequency). In contrast, as shown in graph 200 in FIG. 2, PSR for conventional bias circuit 100 in FIG. 1 decreases (i.e. degrades). Thus, the invention provides a bias circuit having increased PSR compared to conventional bias circuit 100 in FIG. 1. In particular, the invention's bias circuit provides an increased PSR at high frequencies, whereas the PSR provided by conventional bias circuit 100 decreases (i.e. degrades) at high frequencies.

Thus, as discussed above, the present invention advantageously achieves a low-noise bias circuit having increased PSR, i.e. a low-noise bias circuit that is less sensitive to variations in supply voltage, compared to a conventional bias circuit. From the above description of the invention it is manifest that various techniques can be used for implementing the concepts of the present invention without departing from its scope. For example, although a particular type of transistor, e.g. a PMOS transistor, was utilized as an output transistor to illustrate the invention's bias circuit, a different type of transistor could also be used as the output transistor. By way of example and without limitation, the invention's bias circuit could use a bipolar transistor, such as a PNP transistor, as the output transistor.

Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a bias circuit with increased power supply rejection has been described.

The invention claimed is:

1. A power supply rejection bias circuit comprising:
   a first amplifier coupled to a second amplifier, said first amplifier receiving a reference voltage, and a feedback voltage of said bias circuit;
   an output transistor driven by an output of said second amplifier, said output transistor providing an output of said bias circuit and said feedback voltage;
   a feedback resistor directly coupled between an input and said output of said second amplifier so as to cause said output of said second amplifier to form a non-dominant pole of said bias circuit and to cause said output of said bias circuit to form a dominant pole of said bias circuit, thereby increasing power supply rejection of said bias circuit.

2. The bias circuit of claim 1, wherein said feedback voltage is coupled to a positive input of said first amplifier and said reference voltage is coupled to a negative input of said first amplifier.

3. The bias circuit of claim 1, wherein said second amplifier comprises a high gain operational amplifier.

4. The bias circuit of claim 1 further comprising a feedback capacitor coupled between said input and said output of said second amplifier.

5. The bias circuit of claim 1, wherein said bias circuit provides a low impedance at said output of said second amplifier.

6. The bias circuit of claim 1, wherein said output transistor comprises a FET.

7. A power supply rejection bias circuit comprising:
   a first amplifier coupled to a second amplifier, said first amplifier receiving a reference voltage, and a feedback voltage of said bias circuit;
   an output transistor driven by an output of said second amplifier, said output transistor providing an output of said bias circuit and said feedback voltage;
   a feedback resistor coupled between an input and said output of said second amplifier so as to cause said output of said second amplifier to form a non-dominant pole of said bias circuit and to cause said output of said bias circuit to form a dominant pole of said bias circuit, thereby increasing power supply rejection of said bias circuit;
   a feedback capacitor coupled across said feedback resistor.

8. The bias circuit of claim 7, wherein said feedback voltage is coupled to a positive input of said first amplifier and said reference voltage is coupled to a negative input of said first amplifier.

9. The bias circuit of claim 7, wherein said second amplifier comprises a high gain operational amplifier.

10. The bias circuit of claim 7, wherein said bias circuit provides a low impedance at said output of said second amplifier.

11. The bias circuit of claim 10, wherein said bias circuit provides a low impedance at an output of said first amplifier.

12. The bias circuit of claim 7, wherein said output transistor is a FET.

13. A power supply rejection bias circuit comprising:
    a first amplifier coupled to a second amplifier, said first amplifier receiving a reference voltage, and a feedback voltage of said bias circuit;
    a FET having a gate driven by an output of said second amplifier, said FET providing an output of said bias circuit and said feedback voltage;
    a feedback resistor directly coupled between an input and said output of said second amplifier so as to cause said output of said second amplifier to form a non-dominant pole of said bias circuit and to cause said output of said bias circuit to form a dominant pole of said bias circuit, thereby increasing power supply rejection of said bias circuit.

14. The bias circuit of claim 13, wherein said second amplifier comprises a high gain operational amplifier.

15. The bias circuit of claim 13 further comprising a feedback capacitor coupled between an input and said output of said second amplifier.

16. The bias circuit of claim 13, wherein said bias circuit provides a low impedance at said output of said second amplifier.

17. The bias circuit of claim 13, wherein said FET is a PMOS transistor.

* * * * *